US008124328B2

(12) United States Patent
Savariar-Hauck et al.

(10) Patent No.: US 8,124,328 B2
(45) Date of Patent: Feb. 28, 2012

(54) METHODS FOR IMAGING AND PROCESSING POSITIVE-WORKING IMAGEABLE ELEMENTS

(75) Inventors: Celin Savariar-Hauck, Badenhausen (DE); Rene Ullrich, Trebitz (DE); Manuel Klamt, Seesen-Bilderlahe (DE)

(73) Assignee: Eastman Kodak Company, Rochester, NY (US)

( * ) Notice: Subject to any disclaimer, the term of this patent is extended or adjusted under 35 U.S.C. 154(b) by 953 days.

(21) Appl. No.: 12/123,510

(22) Filed: May 20, 2008

(65) Prior Publication Data

US 2009/0291395 A1 Nov. 26, 2009

(51) Int. Cl.
*G03F 7/30* (2006.01)

(52) U.S. Cl. ........ 430/326; 430/302; 430/330; 430/944; 101/463.1

(58) Field of Classification Search ........................ None
See application file for complete search history.

(56) References Cited

U.S. PATENT DOCUMENTS

| | | | | |
|---|---|---|---|---|
| 4,179,208 | A | 12/1979 | Martino | |
| 5,035,982 | A | 7/1991 | Walls | |
| 6,649,319 | B2 | 11/2003 | Fiebag et al. | |
| 7,763,413 | B2 * | 7/2010 | Ray et al. | 430/302 |
| 7,858,292 | B2 * | 12/2010 | Baumann et al. | 430/302 |
| 2005/0266349 | A1 * | 12/2005 | Van Damme et al. | 430/300 |
| 2009/0142702 | A1 * | 6/2009 | Ray et al. | 430/302 |
| 2009/0186301 | A1 * | 7/2009 | Ray et al. | 430/302 |
| 2009/0197206 | A1 * | 8/2009 | Ray et al. | 430/302 |

FOREIGN PATENT DOCUMENTS

| | | | |
|---|---|---|---|
| EP | 1788450 | A1 | 5/2007 |
| WO | 2004/035687 | A1 | 4/2004 |
| WO | 2004/074930 | A2 | 9/2004 |
| WO | 2005/111727 | A2 | 11/2005 |
| WO | 2007/057442 | A2 | 5/2007 |

OTHER PUBLICATIONS

Taden et al , Journal of Polymer Science; Part A: POlymer chemistry, vol. 40 pp. 4333-4343, year 2002.*

U.S. Appl. No. 11/949,810, filed Dec. 4, 2007, titled Imageable Elements With Components Having 1H-Tetrazole Groups, by Harald Baumann et al.

U.S. Appl. No. 11/872,772, filed Oct. 16, 2007, titled Methods for Imaging and Processing Negative-Working Imageable Elements, by Kevin B. Ray et al.

U.S. Appl. No. 11/949,817, filed Dec. 4, 2007, titled Methods of Using Violet-Sensitive Imageable Elements, by Kevin B. Ray et al.

U.S. Appl. No. 12/017,408, filed Jan. 22, 2008, titled Method of Making Lithographic Printing Plates, by Kevin B. Ray et al.

U.S. Appl. No. 12/019,681, filed Jan. 25, 2008, titled Method of Making Images Using Fresh Processing Solution, by Kevin B. Ray et al.

* cited by examiner

*Primary Examiner* — Cynthia Hamilton
(74) *Attorney, Agent, or Firm* — J. Lanny Tucker

(57) ABSTRACT

An imaged and developed element, such as a lithographic printing plate, is provided by infrared radiation imaging of a positive-working imagable element having inner and outer imagable layers. One or both layers contain a polymeric binder having pendant 1H-tetrazole groups. The imaged element is developed with a single processing solution having a pH of from about 5 to about 11 to remove predominantly only the exposed regions and to provide a protective layer over the imaged surface.

18 Claims, No Drawings

METHODS FOR IMAGING AND PROCESSING POSITIVE-WORKING IMAGEABLE ELEMENTS

FIELD OF THE INVENTION

This invention relates to a method of imaging and processing positive-working imagable elements such as positive-working lithographic printing plate precursors. The invention uses a single processing solution that both develops and protects the imaged surface before the imaged element is used in lithographic printing.

BACKGROUND OF THE INVENTION

Radiation-sensitive compositions are routinely used in the preparation of imagable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation-sensitive compositions that can be used to generate free radicals upon thermal imaging and imagable elements containing same are described in numerous publications. Such negative-working imagable elements are generally processed after imaging using aqueous high pH developers. Development using gums is described for example, in EP Publications 1,751,625 (Van Damme et al. published as WO 2005/111727) 1,788,429 (Loccufier et al. et al.), 1,788,430 (Williamson et al.), 1,788,431 (Van Damme et al.), 1,788,434 (Van Damme et al.), 1,788,441 (Van Damme), 1,788,442 (Van Damme), 1,788,443 (Van Damme), 1,788,444 (Van Damme), and 1,788,450 (Van Damme), and WO 2007/057442 (Gries et al.). The imagable elements used in these references have either a protective oxygen-barrier overcoat, an intermediate layer between the substrate and imagable layer, or both.

The patent literature is full of teaching relating to various problems that the industry has been addressing for the last several decades, especially as "computer-to-plate" (CTP) imagable elements and equipment became prominent in the 1990's. Thus, there has been considerable efforts to develop positive-working elements with high imaging sensitivity (high photospeed), fast developability in various developing solutions (generally alkaline in pH), high resistance to degradation to pressroom chemicals ("chemical resistance"), plate durability, storage stability, high image stability, low environmental impact, and high run length.

Some of these problems have been solved by designing unique polymeric binders that are used in imagable layers to provide a matrix for the various imaging components. For example, U.S. Pat. No. 4,511,645 (Kioke et al.) describes the use of polymeric binders having unsaturated side chains in negative-working imagable elements to stabilize image formation. In addition, EP 0 924 570A1 (Fujimaki et al.) describes UV/visible-sensitive compositions and imagable elements containing polymeric binders having amido groups in side chains to increase alkaline solution solubility.

WO 2004/074930 (Baumann et al.) describes the use of polymeric binders having carboxylic acid side groups in combination with oxazole derivatives in UV-sensitive negative-working imagable elements. Such polymeric binders are also used with benzoxazole derivatives in UV-sensitive negative-working imagable elements, as described for example, in WO 2007/090550 (Strehmel et al.).

WO 2004/035687 (Loccufier et al.) describes the use of phenolic polymeric binders in positive- or negative-working imagable elements, which polymeric binders include a thio-linked heterocyclic group attached to the phenolic recurring units in order to increase the chemical resistance of the imagable layers. The heterocyclic groups can be any of a wide variety of sulfur, oxygen, or nitrogen-containing heterocyclic groups.

Copending and commonly assigned U.S. Ser. No. 11/949,810 (filed Dec. 4, 2007 by Baumann, Dwars, Strehmel, Simpson, Savariar-Hauck, and Hauck) describes the use of polymeric binder having pendant 1H-tetrazole groups in imagable elements that are processed using conventional alkaline developers.

Simple processing (development) of imaged elements has become a goal of workers in the lithographic art. For example, copending and commonly assigned U.S. Ser. No. 11/872,772 (filed Oct. 16, 2007 by K. Ray, Tao, Miller, Clark, and Roth) describes negative-working imagable elements that are sensitive to infrared radiation and can be simply processed (developed and "gummed") using finishing gum solutions without the need for a conventional alkaline developer. This reduces the amount of processing equipment that is needed, costs, and consumption of processing solution.

In addition, copending and commonly assigned U.S. Ser. No. 11/947,817 (filed Dec. 4, 2007 by K. Ray, Tao, and Clark) describes the use of gums to develop imaged UV-sensitive, negative-working imagable elements that contain specific nonpolymeric diamide additives.

Copending and commonly assigned U.S. Ser. No. 12/017,408 (filed Jan. 22, 2008 by K. Ray and Kitson) describes the use of a single non-silicate processing solution to both develop and protect images in imaged positive-working lithographic printing plate precursors.

In addition, copending and commonly assigned U.S. Ser. No. 12/019,681 filed Jan. 25, 2008 by K. Ray and Kitson) describes the use of a "fresh" sample of processing solution to provide images in either positive-working or negative-working imagable elements.

U.S. Pat. No. 4,179,208 (Martino) describes a processing machine that uses an alkaline developer that is modified by the addition of a small amount of "gum", and the developer is re-used or replenished but there are no details about the composition of this modified developer.

PROBLEM TO BE SOLVED

Known processing methods using traditional alkaline development followed by gumming have a number of problems that are addressed by the use of "simple" processing methods using a gum-like processing solution. There is a need to provide "simple" processing methods with positive-working lithographic printing plate precursors that avoid the noted problems. There is also a desire to use a simple processing method with imagable elements containing polymeric binders having pendant 1H-tetrazole groups.

SUMMARY OF THE INVENTION

This invention provides a method of making an image comprising:

A) using a laser providing infrared radiation, imagewise exposing a positive-working imagable element comprising a substrate having thereon, in order, an inner imagable layer and an outer imagable layer, to provide exposed and non-exposed regions, wherein either or both of the inner and outer imagable layers comprise a polymeric binder that has a backbone and pendant 1H-tetrazole groups attached to the backbone, and B) applying a single processing solution having a pH of from about 5 to about 11 to the imaged element both: (1) to remove predominantly only the exposed regions, and (2) to provide a protective coating over all of the non-exposed and exposed regions of the resulting lithographic printing plate.

This invention also provides a method of lithographic printing comprising:

A) using a laser providing infrared radiation, imagewise exposing a positive-working imagable element comprising a substrate having thereon, in order, an inner imagable layer and an outer imagable layer, to provide exposed and non-exposed regions, wherein either or both of the inner and outer imagable layers comprise a polymeric binder that has a backbone and pendant 1H-tetrazole groups attached to the backbone, B) applying a single processing solution having a pH of from about 5 to about 11 to the imaged element both: (1) to remove predominantly only the exposed regions, and (2) to provide a protective coating over all of the non-exposed and exposed regions of the resulting lithographic printing plate, C) removing excess single processing solution from the lithographic printing plate, and optionally drying the lithographic printing plate, and D) without removing the protective coating, using the lithographic printing plate for printing an image using a lithographic printing ink.

The substrate can be an aluminum-containing substrate having a hydrophilic surface upon which the imagable layer is disposed, and the imaged and processed element can be a lithographic printing plate.

With the present invention, positive-working, multi-layer imagable elements can be imaged and then processed without the use of high pH, toxic, and corrosive developers. Instead, processing can be carried out using simple processing solutions that both develop the image and protect the developed surface. Improved chemical resistance, run length, developability, and photospeed have been achieved using imagable elements containing polymeric binders that have pendant 1H-tetrazole groups. It was previously unappreciated that such polymeric binders could be processed with the single processing solutions described herein.

DETAILED DESCRIPTION OF THE INVENTION

Definitions

Unless the context indicates otherwise, when used herein, the terms "positive-working imagable element", "positive-working lithographic printing plate precursor", and "positive-working printing plate precursor" are meant to be references to embodiments useful in the present invention.

In addition, unless the context indicates otherwise, the various components described herein such as "first polymeric binder", "second polymeric binder", "infrared radiation absorbing compound", and similar terms also refer to mixtures of such components. Thus, the use of the articles "a", "an", and "the" is not necessarily meant to refer to only a single component.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Polymeric Binders with 1H-Tetrazole Groups

The imagable elements have at least one imagable layer (described below) that contains one or more polymeric binders that have pendant 1H-tetrazole groups. In an alkaline solution, the tetrazole groups lose a hydrogen atom at the 1-position, as illustrated in the following Equation (1):

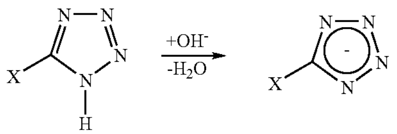

(1)

wherein X represents the linking group connected to a polymer backbone. In many embodiments (but not all), the 1H-tetrazole is connected at its 5-position to a nitrogen atom (that is, X includes a nitrogen atom directly attached to the tetrazole ring).

The polymeric binders generally have a molecular weight of up to about 500,000. More typically, the polymer binders useful in this invention have a molecular weight of from about 5,000 to about 100,000.

Polymeric binders useful in this invention can be generally represented by the following Structure (I):

$$-(A)_x-(B)_y- \quad (I)$$

wherein A represents recurring units comprising the 1H-tetrazole groups, B represents recurring units not containing 1H-tetrazole groups, x is from about 3 to 100 mol %, and y is from 0 to about 97 mol %. Typically, x is from about 3 to about 90 mol %, y is from about 10 to about 97 mol %, and B represents recurring units derived, for example, from one or more allyl (meth)acrylates, alkyl (meth)acrylates, hydroxyalkyl (meth)acrylates, (meth)acrylamides that can be substituted by alkyl or aryl groups, (meth)acrylates of polyethylene oxide or propylene oxide, (meth)acrylonitriles, styrene or styrene derivatives, vinyl acetate, vinyl carbazole, vinyl pyrrolidone, vinyl alcohol, N-substituted maleimides, or half esters of ring-opened maleic acid anhydrides. Other monomers from which B recurring units can be derived would be readily apparent to a skilled artisan.

A can represent recurring units providing a carbon-carbon backbone derived from one or more ethylenically unsaturated polymerizable monomers, and the 1H-tetrazole groups can be attached to the backbone through a linking group L comprising a —C(═O)—$NR^1$—, —$NR^1$—, —$NR^1$—(C═O)—$NR^2$—, —S—, —OCO(═O)—, or —CH═N— group, or a combination thereof. Particularly useful linking groups include —C(═O)—$NR^1$— and —$NR^1$—(C═O)—$NR^2$—. The noted linking groups can be directly attached to the backbone or attached through an organic group having up to 30 atoms in the linking chain.

The 1H-tetrazole groups can be introduced into polymers in a number of ways. For example, the polymers useful in the present invention can be made by polymerization of Compound $A_1$ to $A_8$ (see TABLE A below) with co-monomers such as those described above for obtaining the B recurring units and others that would be readily apparent to one skilled in the art.

TABLE A

| Reaction partner for 1H-tetrazole-5-amine | Reaction product |
|---|---|
| 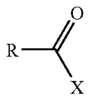 wherein X is halogen, —OR′, —OCO—R′, R′ is alkyl, R is —CH═C(R″), and R″ is H or methyl | 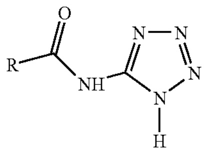 $A_1$ |
| 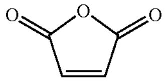 | 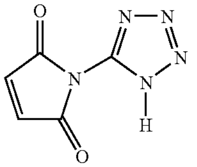 $A_2$ |
| $R^8$—C≡N wherein $R^8$ is —CH═C(R″) and R″ is H or methyl | 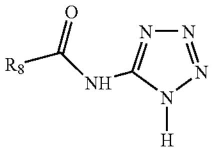 $A_3$ |
| $R^1$—X wherein $R^1$ is —CH═C(R″)—COO—X′—R″ is H or methyl, X′ is a $C_2$-$C_4$ alkylene, X is halogen | 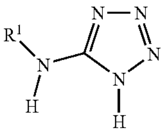 or 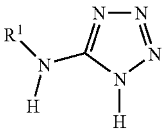 $A_4$ $A_4'$ |
| 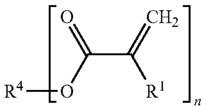 wherein $R^4$ is a linear, branched, or cyclic aliphatic residue, n is an integer from 2 to 10 | 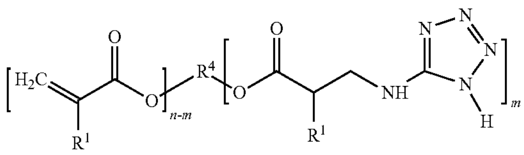 $A_5$ m is an integer of from 1 to 9 with the proviso that m < n |

TABLE A-continued

| Reaction partner for 1H-tetrazole-5-amine | Reaction product |
|---|---|
| 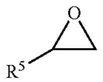 wherein $R^5$ is a residue having at least 1 ethylenically unsaturated group | 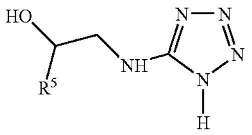 $A_6$ |
| $R^3$—NCO wherein $R^1$ is —CH═C(R")—COO—X'—R" is H or methyl, and X' is a $C_2$-$C_4$ alkylene | 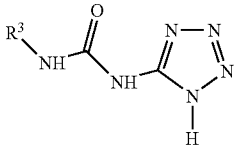 $A_7$ |
| 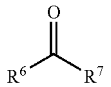 wherein $R^6$ is an alphatic residue having at least one ethylenically unsaturated group, and $R^7$ is an alkyl | 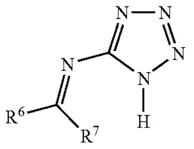 $A_8$ |

Alternatively, the 1H-tetrazole groups can be introduced into polymers already having reactive functionalities. Examples of such reactive polymers are those having reactive isocyanato groups, (meth)acrylate groups, epoxy groups, polymeric acid chlorides, halomethyl group, cyclic anhydride, or reactive aldehyde or ketone groups as shown above. Typical examples of such reactive polymers are those derived from reacting hydroxyl or amine functionalised polymers with isocyanate functionalised tetrazole monomers that can be obtained for example by reacting di-isocyanates with aminotetrazole. Tetrazole-functionalized poly(meth)acrylate copolymers can be obtained, for example, by reacting 1H-tetrazole-5-amine with (meth)acrylic acid chloride. Maleic anhydride copolymers can be reacted with 1H-tetrazole-5-amine to give tetrazole derivatized polymers. Other such polymers can be derived by reacting polymers having functional groups such as epoxy, chloromethylated styrene, cyclic acid anhydride, or methyl vinyl ketone groups.

Imagable Layers

The positive-working imagable elements include at least two imagable layers (described below) disposed on a suitable substrate to form an imagable layer. These elements can be printed circuit boards for integrated circuits, microoptical devices, color filters, photomasks, and printed forms such as lithographic printing plate precursors that are defined in more detail below.

The imagable elements are generally responsive to infrared imaging radiation corresponding to the spectral range of at least 700 nm and up to and including 1400 nm (typically from about 750 to about 1200 nm). This sensitivity is provided by the presence of one or more infrared radiation absorbing compounds, chromophores, or sensitizers, that absorb imaging radiation, or sensitize the composition to desired imaging infrared radiation having a $\lambda_{max}$ of from about 700 nm and up to and including 1400 nm. These compounds are usually in the "inner" imagable layer described below.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), and 6,787,281 (Tao et al.), and EP 1,182,033A2 (noted above). Infrared radiation absorbing N-alkylsulfate cyanine dyes are described for example in U.S. Pat. No. 7,018,775 (Tao).

A general description of one class of suitable cyanine dyes is shown by the formula in paragraph [0026] of WO 2004/101280 (Munnelly et al.), incorporated herein by reference, and a useful IR absorbing compound is identified below with the Examples.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Other useful IR-sensitive dyes having the desired chromophore can be defined by the following Structure DYE-I:

DYE-I

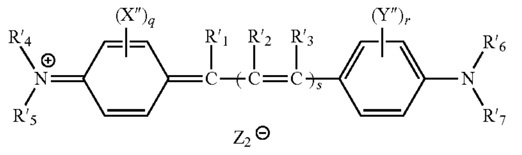

wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 1, 2, or 3, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

DYE-II

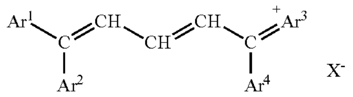

wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Two representative IR dyes defined by Structure (DYE-II) are defined as D1 and D2 in WO 98/07574 (Patel et al.). Still other useful IR-sensitive dyes are represented by the following Structure (DYE-III):

(DYE-III)

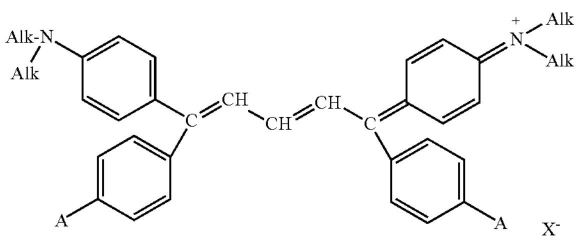

wherein "Alk" represents the same or different substituted or unsubstituted alkyl groups having 1 to 7 carbon atoms (such as substituted or unsubstituted methyl, ethyl, iso-propyl, t-butyl, n-hexyl, and benzyl), and "A" represents hydrogen or the same or different substituted or unsubstituted lower alkyl group having 1 to 3 carbon atoms (such as methyl, ethyl, n-propyl, and iso-propyl), or the same or different dialkylamino groups similar to those defined above for Structure (DYE-2), wherein such groups have the same or different alkyl groups. $X^-$ is a suitable counterion as defined above for Structure (DYE-II).

Useful infrared radiation absorbing dyes can be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the imagable element in an amount generally of at least 1% and up to and including 30% and typically at least 3 and up to and including 20%, based on total solids in the composition, that also corresponds to the total dry weight of the imagable layer. The particular amount needed for this purpose would be readily apparent to one skilled in the art, depending upon the specific compound used to provide the desired chromophore.

The substrate generally has a hydrophilic surface, or at least a surface that is more hydrophilic than the applied imagable layers on the imaging side. The substrate comprises a support that can be composed of any material that is conventionally used to prepare imagable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imagable element.

The substrate can also be a cylindrical surface having the imagable layer thereon, and thus be an integral part of the printing press. The use of such imaging cylinders is described for example in U.S. Pat. No. 5,713,287 (Gelbart).

In general, the multi-layer, positive-working imagable elements of this invention comprise a substrate, an inner layer (also known in the art as an "underlayer"), and an outer layer (also known in the art as a "top layer" or "topcoat") disposed over the inner layer. Before thermal imaging, the outer layer is generally not soluble or removable by the processing solution described below within the usual time allotted for development, but after thermal imaging, the exposed regions of the outer layer are soluble in the processing solution. The inner layer is also generally removable by the processing solution. A radiation absorbing compound (described above) is typically present in the inner layer but may optionally be in a separate layer between the inner and outer layers.

The imagable elements are formed by suitable application of an inner layer composition onto a suitable substrate as described above. The substrate generally has a hydrophilic surface or at least a surface that is more hydrophilic than the outer layer composition.

The inner layer is disposed between the outer layer and the substrate. Typically, it is disposed directly on the substrate (including any hydrophilic coatings as described above). In most embodiments, the inner layer comprises the polymeric binders described above as having pendant 1H-tetrazole groups as a primary polymeric binder, and optionally one or more other polymeric binders as described below. This primary polymeric binder is usually insoluble in the solvent used to coat the outer layer so that the outer layer can be coated over the inner layer without dissolving the inner layer. Mixtures of these polymeric binders can be used if desired in the inner layer. Such polymeric binders are generally present in the inner layer in an amount of at least 50 weight %, and generally from about 60 to 95 weight % of the total dry inner layer weight.

Optional useful polymeric binders for the inner layer include (meth)acrylonitrile polymers, (meth)acrylic resins comprising carboxy groups, polyvinyl acetals, maleated wood rosins, styrene-maleic anhydride copolymers, (meth) acrylamide polymers including polymers derived from N-alkoxyalkyl methacrylamide, polymers derived from an N-substituted cyclic imide, polymers having pendant cyclic urea groups, and combinations thereof. Still other useful polymeric binders include polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % of recurring units derived from acrylamide, methacrylamide, or a mixture thereof, and from about 5 to about 30 mol % of recurring units derived from methacrylic acid. Other hydrophilic monomers, such as hydroxyethyl methacrylate, may be used in place of some or all of the methacrylamide. Other monomers such as acrylic acid may be used in place of some or all of the methacrylic acid. Optionally, these polymers can also include recurring units derived from (meth)acrylonitrile or N-[2-(2-oxo-1-imidazolidinyl)ethyl]-methacrylamide.

Still other useful polymeric binders in the inner layer can comprise, in polymerized form, from about 5 mol % to about 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % of recurring units derived from N-phenylmaleimide, N-cyclohexylmaleimide, or a mixture thereof, optionally, from about 5 mol % to about 50 mol % of recurring units derived from methacrylamide, and from about 3 mol % to about 50 mol % one or more recurring units derived from monomer compounds of the following Structure:

$$CH_2{=}C(R_2){-}C({=}O){-}NH{-}CH_2{-}OR_1$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl, as described for example in U.S. Pat. No. 7,186,482 (Kitson et al.). Methods of preparation of certain of these polymeric materials are disclosed in U.S. Pat. No. 6,475,692 (Jarek).

Additional useful polymeric binders for the inner layer are described for example, in U.S. Pat. Nos. 7,144,661 (Ray et al.), 7,163,777 (Ray et al.), and 7,223,506 (Kitson et al.), and U.S. Patent Application Publications 2006/0257764 (Ray et al.) and 2007/0172747 (Ray et al.).

The additional polymeric binders can comprise more than 10% and up to 50% (dry weight) of the total polymeric materials in the inner layer. Still other useful additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the following Structure (XI):

$$CH_2{=}C(R_{23}){-}CO_2{-}CH_2CH_2{-}NH{-}CO{-}NH\text{-}p\text{-}C_6H_4{-}R_{22} \quad (XI)$$

wherein $R_{22}$ is OH, COOH, or $SO_2NH_2$, and $R_{23}$ is H or methyl, and, optionally, from about 1 to about 30 mole % from about 3 to about 20 mole % of recurring units derived from one or more monomers of the following Structure (XII):

$$CH_2{=}C(R_{25}){-}CO{-}NH\text{-}p\text{-}C_6H_4{-}R_{24} \quad (XII)$$

wherein $R_{24}$ is OH, COOH, or $SO_2NH_2$, and $R_{25}$ is H or methyl.

The inner layer may also comprise one or more additional polymeric materials that are resins having activated methylol and/or activated alkylated methylol groups. The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical). The resin having activated methylol and/or activated alkylated methylol groups is typically a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide). Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 (Shimazu et al.) and 6,528,228 (Savariar-Hauck et al.).

In some embodiments, the polymeric binder having pendant 1H-tetrazole groups is present in the outer layer (described below), and the inner layer can comprise one or more of the polymeric binders described above. For example, in these embodiments, the outer layer can comprise on or more polymeric binders having pendant carboxy groups or polymeric binders having recurring units that are derived from anhydride monomers such as maleic anhydride.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of from about 0.5 to about 2.5 $g/m^2$ and typically from about 1 to about 2 $g/m^2$. As noted above, the polymers having pendant 1H-tetrazole groups can be the only polymeric binder in the inner layer, or one among several polymeric binders.

The outer layer of the imagable element is disposed over the inner layer and in most embodiments there are no intermediate layers between the inner and outer layers. The outer layer comprises one or more polymeric binders that are the same or different than the polymeric binders used in the inner layer.

For example, in some embodiments, the outer layer includes a polymeric binder that has pendant 1H-tetrazole groups as described above. This type of polymeric binder can be present in both the inner and outer layers, or only in the outer layer.

As pointed out above, in most embodiments, the polymeric binder having pendant 1H-tetrazole groups is present only in the inner layer, and the outer layer comprises one or more polymeric binders such as phenolic resins having pendant carboxy, anhydride, sulfonamide, sulfonic acid, phosphonic acid, or phosphoric acid groups. Phenolic resins having such groups are well known in the art.

Such outer layer polymeric binders can be poly(vinyl phenols) or derivatives thereof, or phenolic resins or polymers. These resins may include pendant carboxylic (carboxy), sulfonic (sulfo), sulfonamide, phosphonic (phosphono), or phosphoric acid groups. Other useful secondary polymeric binders include but are not limited to, novolak resins, resole resins, poly(vinyl acetals) having pendant phenolic groups, and mixtures of any of these resins (such as mixtures of one or more novolak resins and one or more resole resins). The novolak resins are most useful in combination with the polymer binders having pendant 1H-tetrazole groups. Generally, such resins have a number average molecular weight of at least 3,000 and up to 200,000, and typically from about 6,000 to about 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful outer layer polymeric binders include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. Nos. 5,554,719 (Sounik) and 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon et al.), that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, or typically from about 1,000 to about 10,000, and more typically from about 3,000 to about 7,000. In addition, they may have a polydispersity less than 2 and preferably from about 1.5 to about 1.9. The branched poly(hydroxystyrenes) can be homopolymers or copolymers with non-branched hydroxystyrene recurring units.

One group of useful outer layer polymeric binders include poly(vinyl phenol) and derivatives thereof. Such polymers are obtained generally by polymerization of vinyl phenol monomers, that is, substituted or unsubstituted vinyl phenols. Substituted vinyl phenol recurring units include those described below for the "a" recurring units in Structure (I). Some vinyl phenol copolymers are described in EP 1,669,803A (Barclay et al.).

Other useful outer layer polymeric binders are modified novolak or resole resins that are represented by Structure (POLYMER):

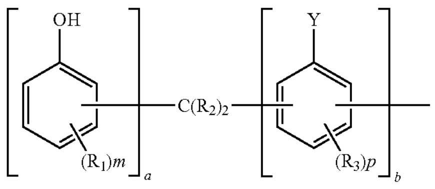

wherein (POLYMER)

Y is 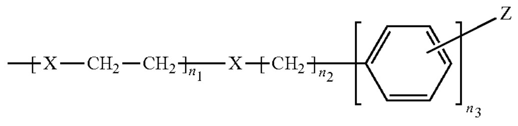

a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(═O)Ar—, —OC(═O)CH═CH—, or —OCO$(CH_2)_{n4}$— group wherein Ar is an aryl group, m and p are independently 1 or 2, $n_3$ is 0 or an integer up to 5 (for example 0, 1, 2, or 3), $n_2$ is 0 or an integer up to 5 (for example, 0, 1, or 2), $n_3$ is 0 or 1 (typically 0), $n_4$ is at least 1 (for example, up to 8), and Z is —C(═O)OH, —S(═O)$_2$OH, —P(═O)(OH)$_2$, or —OP(═O)(OH)$_2$.

The alkyl and alkoxy groups present in the polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain. Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the outer layer polymeric binder comprises recurring units represented by Structure (POLYMER) wherein a is from about 92 to about 98 mol %, b is from about 2 to about 8 mol % and Z is —C(═O)OH, and is present at a dry coverage of from about 15 to 100 weight % based on the total dry weight of the layer.

Other polymeric binders that may be in the outer layer include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. Nos. 5,705,308 (West et al.) and 5,705,322 (West et al.). Other useful polymeric binders include acrylate copolymers as described for example in EP 737,896A (Ishizuka et al.), cellulose esters and poly(vinyl acetals) as described for example in U.S. Pat. No. 6,391,524 (Yates et al.), DE 10 239 505 (Timpe et al.), and WO 2004081662 (Memetea et al.).

Still other useful outer layer polymeric binders are described for example, in U.S. Pat. Nos. 7,163,770 (Saraiya et al.) and 7,160,653 (Huang et al.).

The polymeric binder(s) can be present in the outer layer at a dry coverage of from about 15 to 100 weight % (typically from about 30 to about 95 weight %) based on the total dry outer layer weight.

In many embodiments, the outer layer is substantially free of radiation absorbing compounds, meaning that none of these compounds are purposely incorporated therein and insubstantial amounts diffuse into it from other layers. However, in other embodiments, the radiation absorbing compound may be in the outer layer only, or in both the outer and inner layers, as described for example in EP 1,439,058A2 (Watanabe et al.) and EP 1,738,901A1 (Lingier et al.), as in an intermediate layer as described above.

The one or more second polymeric binders are present in the outer layer at a dry coverage of from about 15 to 100 weight %, typically from about 70 to about 98 weight %, based on total dry weight of the outer layer.

The outer layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imagable element. The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of from about 0.2 to about 2 $g/m^2$ and typically from about 0.4 to about 1.5 $g/m^2$.

There may be a separate layer that is between and in contact with the inner and outer layers. This separate layer can act as a barrier to minimize migration of radiation absorbing compound(s) from the inner layer to the outer layer. This separate "barrier" layer generally comprises other polymeric binders that are soluble in the processing solution. If this polymeric binder is different from the first polymeric binder(s) in the inner layer, it is typically soluble in at least one organic solvent in which the inner layer first polymeric binders are insoluble. A useful polymeric binder is a poly(vinyl alcohol).

Alternatively, there may be a separate layer between the inner and outer layers that contains the infrared radiation absorbing compound(s), which may also be present in the inner layer, or solely in the separate layer.

The multi-layer imagable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imagable element is wrapped or encased in a water-impermeable sheet material to represent an effective barrier to moisture removal from the precursor, or the heat treatment of the imagable element is carried out in an environment in which relative humidity is controlled to at least 25%. In addition, the water-impermeable sheet material can be sealed around the edges of the imagable element, with the water-impermeable sheet material being a polymeric film or metal foil that is sealed around the edges of the imagable element.

In some embodiments, this heat treatment can be carried out with a stack comprising at least 100 of the same imagable elements, or when the imagable element is in the form of a coil or web. During conditioning, the individual imagable elements may be separated by suitable interleaving papers. Such papers are available from several commercial sources. After conditioning, the interleaving papers may be kept between the imagable elements during packing, shipping, and use by the customer.

Imaging Conditions

The imagable elements can have any useful form and size or shape including but not limited to, printing plate precursors, printing cylinders, printing sleeves (both hollow or solid), and printing tapes (including flexible printing webs).

During use, the imagable element is exposed to a suitable source of infrared or near-infrared imaging or exposing radiation depending upon the infrared radiation absorbing compound present in the imagable element, at a wavelength of from about 700 to about 1500 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imagable element is usually a diode laser (or array of lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imagable member mounted to the interior or exterior cylindrical surface of the drum. An example of an useful imaging apparatus is available as models of Kodak® Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 $mJ/cm^2$ and up to and including 500 $mJ/cm^2$, and typically at least 50 and up to and including 300 $mJ/cm^2$ depending upon the sensitivity of the imagable layer.

Development and Printing

The imaged and heated elements are processed "off-press" using the single processing solution described herein. Processing is carried out for a time sufficient to remove predominantly only the exposed regions of the inner and outer imagable layers to reveal the hydrophilic surface of the substrate, but not long enough to remove significant amounts of the non-exposed regions. The revealed hydrophilic surface repels inks while the non-exposed regions accept ink. Thus, the exposed regions to be removed are "soluble" or "removable" in the processing solution because they are removed, dissolved, or dispersed within it more readily than the regions that are to remain. The term "soluble" also means "dispersible".

The processing solution both "develops" the imaged element by removing predominantly the exposed regions and also provides a protective layer or coating over the entire imaged and developed surface. In this aspect, the processing solution can behave somewhat like a gum that is capable of protecting the lithographic image on the printing plate against contamination or damage (for example, from oxidation, fingerprints, dust, or scratches).

There are generally two types of "gum" solutions known in the art: (1) a "bake", "baking", or "pre-bake" gum usually contains one or more compounds that do not evaporate at the usual pre-bake temperatures used for making lithographic printing plates, typically an anionic or nonionic surfactant, and (2) a "finisher" gum that usually contains one or more hydrophilic polymers (such as gum Arabic, cellulosic compounds, (meth)acrylic acid polymers, and polysaccharides) that are useful for providing a protective overcoat on a printing plate.

By using this processing solution, the conventional aqueous alkaline developer compositions containing silicates or metasilicates. Some embodiments are essentially free of organic solvents but other embodiments include up to 8 weight % of one or more organic solvents such as benzyl alcohol. Other water-miscible solvents that may be present include but are not limited to, the reaction products of phenol with ethylene oxide and propylene oxide such as ethylene glycol phenyl ether (phenoxyethanol), esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. By "water-miscible" we mean that the organic solvent or mixture of organic solvents is either miscible with water or sufficiently soluble in the processing solution that phase separation does not occur.

One advantage of this invention is that once the processing solution is used in this manner, no separate rinsing step is necessary before using the resulting lithographic printing plate for printing. However, before printing, any excess processing solution may be removed from the lithographic printing plate by wiping or using a squeegee or a pair of nip rollers in an apparatus, followed by optional drying using any suitable drying means. The processing solution can be recycled and reused multiple times, replenished or regenerated as necessary, or used as single fresh samples that are discarded after a single use.

The processing solution may be provided in diluted or concentrated form. The amounts of components described below refer to amount in the diluted processing solution that is likely its form for use in the practice of the invention. However, it is to be understood that the present invention includes the use of concentrated processing solution and the amounts of various components (such as the anionic surfactants) would be correspondingly increased.

The processing solution used in this invention is an aqueous solution that generally has a pH greater than 5 and up to about 11, and typically from about 6 to about 11, or from about 6.5 to about 10, as adjusted using a suitable amount of a base. The viscosity of the processing solution can be adjusted to a value of from about 1.7 to about 5 cP by adding a suitable amount of a viscosity increasing compound such as a poly(vinyl alcohol) or poly(ethylene oxide).

Various components can be present in the processing solution to provide the development and gumming functions, except for those components specifically excluded below.

For example, some of the processing solutions have as an essential component, one or more anionic surfactants, all though optional components (described below) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhdyride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 5 or from about 8 weight % and up to 45 weight %, or up to 30 weight % (% solids). In some embodiments, the one or more anionic surfactants may be present in an amount of from about 8 to about 20 weight %.

Two or more anionic surfactants ("first", "second", etc.) can be used in combination. In such mixtures, a first anionic surfactant, such as an alkyldiphenyloxide disulfonate, can be present generally in an amount of at least 1 weight % and typically from about 5 to about 20 weight %. A second surfactant can be present (same or different from the first anionic surfactant) in a total amount of at least 1 weight %, and typically from about 3 to about 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The processing solutions useful in this invention may optionally include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglygol. These nonionic surfactants can be present in an amount of up to 10 weight %, but at usually less than 2 weight %.

Other optional components of the gum include inorganic salts (such as those described in [0032] of U.S. Patent Application 2005/0266349, noted above), wetting agents (such as a glycol), hydrophilic film-forming polymers such as polyethylene glycol and polyvinyl alcohols, alkanol amines such as monoethanol amine and diethanol amine, metal chelating agents, antiseptic agents, anti-foaming agents, ink receptivity agents (such as those described in of US '349), and viscosity increasing agents described for example in pages 8-15 of WO 2007/060200 (Andriessen et al.). The amounts of such components are known in the art. Other useful addenda include but are not limited to, phosphonic acids or polycarboxylic acids, or salts thereof that are different than the anionic surfactants noted above. Such polyacids can be present in an amount of at least 0.001 weight % and typically from about 0.001 to about 10 weight % (% solids), and can include but are not limited to, polyaminopolycarboxylic acids, aminopolycarboxylic acid, or salts thereof, [such as salts of ethylenediaminetetraacetic acid (EDTA, sodium salt)], organic phosphonic acids and salts thereof, and phosphonoalkanetricarboxylic acids and salts thereof.

The processing solution can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the exposed regions using a spray nozzle system as described for example in [0124] of EP 1,788,431A2 (noted above) and U.S. Pat. No. 6,992,688 (Shimazu et al.). Still again, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following processing, the resulting lithographic printing plate can be used for printing without any need for a separate rinsing step using water.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

The components and materials used in the examples and analytical methods used in evaluation were as follows:

BLO represents γ-butyrolactone.

Byk® 307 is a polyethoxylated dimethyl polysiloxane copolymer that is available from Byk Chemie (Wallingford, Conn.) in a 25 wt. % xylene/methoxypropyl acetate solution.

Copolymer E was derived from N-phenylmaleimide (37 mol %), methacrylamide (20 mol %), methacrylic acid (14 mol %), and N-(2-methacryloyloxyethyl)ethylene urea (29 mol % with an acid number of 52.

D11 dye is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

DEK represents diethyl ketone.

Dowanol® PM is propylene glycol methyl ether (1-methoxy-2-propanol) that is available from Dow Chemical (Midland, Mich.).

Dowanol® PMA represents 1-methoxy-2-propyl acetate.

IR Dye A (Trump) has the following structure:

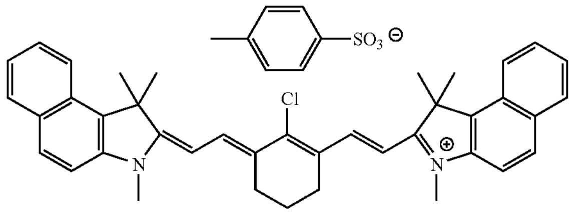

MX 1591 is a pre-bake gum (pH=4.2) that is available from Eastman Kodak Company (Rochester, N.Y.).

SMA 1000 is a copolymer derived from styrene and maleic anhydride that is available from Sartomer Company (Exton, Pa.).

Substrate A represents a 0.3 gauge aluminum sheet that had been electrochemically grained, anodized, and then treated with a solution of poly(vinyl phosphonic acid).

TABLE I

| | Methacylamide-N-tetrazole | Methacrylic acid | N-Phenyl maleimide | N-(2-methacryloyloxy-ethyl) ethylene urea | Methyl methacrylate |
|---|---|---|---|---|---|
| Copolymer A | 13.64 g | 0 g | 24.24 g | 38.32 g | 0 g |
| Copolymer B | 11.06 g | 0 g | 27.42 g | 38.32 g | 0 g |
| Copolymer C | 5.65 g | 0 g | 0 g | 0 g | 29.36 g |
| Copolymer D | 9.41 g | 4.02 g | 21.36 g | 38.32 g | 0 g |

Copolymers A, B, and D were synthesized by placing the monomers in a solvent mixture of 200 g of dioxolane, 50 g of water, and 100 g of ethanol solvent as shown in the above TABLE I in a 500-ml four-necked round bottom flask equipped with a condenser, a nitrogen supply, a thermometer, a stirrer, and a heating mantle. Nitrogen is bubbled through the solution while the temperature was raised to 75° C. AIBN (1.2 g) was added to the reaction mixture and after 1 hour three further additions of 0.4 g AIBN were made at one-hour intervals as the temperature of the reaction mixture was maintained at 75° C. After an additional one-hour period, the reaction mixture was allowed to cool. Each of the resulting copolymers was isolated by precipitation in 2.6 liters of water to which 1 ml of HCl (30 wt. %) had been added. Each precipitate was filtered, washed with 0.5 liter of water and filtered again. Each polymer was dried to constant weight in a fluid bed dryer at 40° C. The yield of each polymer was about 91%.

Copolymer C was prepared in a 250 ml 3-neck round bottomed flask fitted with stirring, temperature monitoring, reflux and nitrogen purging that was set-up in a thermostatic water bath. To the flask containing the solvents the monomers were added and heated to 75° C. while flushing with nitrogen. The reaction was initiated by adding 0.19 g of the initiator AIBN. After 1 hour of reaction time, another 0.19 g of AIBN was added. After a further reaction time of 4 hours, the solution was allowed to cool down. The polymer was isolated by precipitation in water and it was dried at 40° C. overnight to give an yield of 84%.

Invention Examples 1-7

Positive-working imagable elements of this invention were prepared as follows:

Inner Imagable Layer:

Inner imagable layer formulations were prepared by dissolving 2.06 g of the copolymer indicated in TABLE II, 0.38 g of IR Dye A, 0.038 g of dye D11, and 0.038 g of Byk® 307 in 37.5 g of a solvent mixture of 1,3-Dioxolane:methanol: BLO:water 60/20/10/10 wt. %, coating the formulations onto samples of Substrate A, and drying the coated layers at 135° C. for 45 seconds to provide a dry coating weight of 1.35 $g/m^2$.

TABLE II

| Inner Imageable Layer | Copolymer |
|---|---|
| 1 | A |
| 2 | B |
| 3 | D |
| 4 | E |

Outer Imagable Layer 1:

This formulation was prepared by dissolving 2.4 g of Copolymer C, 0.012 g of Byk® 307, and 0.013 g of Ethyl Violet in 20 g of a solvent mixture (DEK:Dowanol® PMA: isopropyl alcohol at 8:1:1 weight ratio).

Outer Imagable Layer 2:

This formulation was made by dissolving 2.38 g of SMA1000, 0.032 g of Ethyl Violet, 0.030 g of Byk® 307 in 40 g of a solvent mixture of diethyl ketone (DEK) and Dowanol® PMA (92:8 wt ratio).

Two-layer imagable elements were prepared by coating the outer imagable layer formulations over the inner imagable layer formulations as shown in the following TABLE III to give a outer imagable layer coating weight of about 0.65 g/m.

TABLE III

| Invention Example | Inner Imageable Layer | Outer Image-able Layer | Processor type | Optimum Developer dwell time and Temperature | Clear Point |
|---|---|---|---|---|---|
| 1 | 1 | 2 | Spray bars | 30 sec/ 24° C. | 108 mJ/cm$^2$ |
| 2 | 2 | 2 | Spray bars | 20 sec/ 23° C. | 92 mJ/cm$^2$ |
| 3 | 2 | 1 | Spray bars | Not done | 92 mJ/cm$^2$ |
| 4 | 4 | 2 | Dip tank | 11 sec/ 23° C. | 92 mJ/cm$^2$ |
| 5 | 5 | 1 | Spray bars | 30 sec/ 23° C. | 108 mJ/cm$^2$ |
| 6 | Sword Japan | | Spray bars | 20 sec/ 22° C. | 75 mJ/cm$^2$ |
| 7 | Sword Japan | | Dip tank | 11 sec/ 20° C. | 92 mJ/cm$^2$ |

The resulting positive-working, IR-sensitive imagable elements were dried at 135° C. for 45 seconds. A power series starting from 4 watts to 16 watts (33 to 134 mJ/cm$^2$) at a drum speed of 360 rpm was used for imaging on a Kodak® Trendsetter Quantum II platesetter using internal test patterns "plot 0" and "plot 12".

The Invention Examples 1-4 elements were developed in SP211 Developer (Eastman Kodak Company) using table processors having either a dip tank development or a spray bar development. The TD22 Processor that is available from Heights-USA (New Jersey) was equipped with spray bars to dispense the developer over the plate and molten-covered scrub rollers, a squeegee, and dryers.

The TDP 60 processor is a table processor used for dip tank development and is also available from Technigraph (UK), and equipped with molten-covered scrub rollers and squeegee. The developed plates are then dried with blown air.

The imaged elements were processed to give dwell times between 10 and 40 seconds at temperatures ranging from 20° C. to 26° C. to find the optimum development conditions where clean non-image areas provided good resolution of the 1% dots at 200 lpi. The minimum energy required to obtain a clean background at the optimum processing conditions are shown above in TABLE III.

The resulting lithographic printing plates were mounted on a Roland 200 Press that was charged with Offset S 7184 Ink abrasive ink with 10% Bologeneser Kreide from Sun Chemicals. The press was started with the dampening system made up of 4% Combifix XL 804 and 10% Isopropyl alcohol. After a few revolutions, the inking system was engaged. Clean copies were obtained with less than 10 sheets.

"Press restart" for the printing plates was evaluated by stopping the press after 10,000 copies with the printing plates completely inked, and restarting the press after 30 minutes. Clean copies were then obtained after about 20 copies.

Printing plates obtained from Invention Examples 1-5 were tested for run length together and compared to a single-layer positive-working imagable element that is commercially available as Sword Ultra printing plate that was processed in a conventional multi-step processing that includes development, rinse, and gumming steps. Good run lengths of 60,000 and 80,000 copies were obtained using the printing plates obtained from Invention Examples 1-5 respectively, and 80,000 copies for the Sword Ultra printing plate without any toning or loss in image quality. However, the present invention enables the use of multi-layer imagable elements with simpler processing methods and solutions.

The invention has been described in detail with particular reference to certain preferred embodiments thereof, but it will be understood that variations and modifications can be effected within the spirit and scope of the invention.

The invention claimed is:

1. A method of making an image comprising:

A) using a laser providing infrared radiation, imagewise exposing a positive-working imageable element comprising a substrate having thereon, in order, an inner imageable layer and an outer imageable layer, to provide exposed and non-exposed regions, wherein either or both of said inner and outer imageable layers comprise a polymeric binder that has a backbone and pendant 1H-tetrazole groups attached to said backbone, and B) applying a single processing solution having a pH of from about 5 to about 11 to said imaged element both: (1) to remove predominantly only said exposed regions, and (2) to provide a protective coating over all of said non-exposed and exposed regions.

2. The method of claim 1 wherein said single processing solution has a pH of from about 6 to about 11 and comprises at least 1 weight % of one or more anionic surfactants.

3. The method of claim 2 wherein said single processing solution further comprises at least 0.01 weight % of an alkanol amine, organic phosphonic acid or polycarboxylic acid, or a salt of either acid that is different than said one or more anionic surfactants.

4. The method of claim 2 wherein said single processing solution further comprises a hydrophilic film-forming polymer.

5. The method of claim 2 wherein at least one of said one or more anionic surfactants has a sulfonic acid group or salt thereof and is present in said single processing solution in an amount of from about 1 to about 45 weight %.

6. The method of claim 1 wherein said single processing solution has no more than 8 weight % of organic solvents.

7. The method of claim 1 wherein said polymeric binder having pendant 1H-tetrazole groups is present in said inner layer, or it is present in both said inner and outer layers.

8. The method of claim 1 wherein said outer layer comprises said polymeric binder having pendant 1H-tetrazole groups, or said outer layer comprises a phenolic resin having pendant carboxy, sulfonic acid, sulfonamide, phosphono, or phosphoric acid groups.

9. The method of claim 1 wherein said 1H-tetrazole groups are present in said polymeric binder sufficient to provide at least 50 mol % of all acidic groups in said polymeric binder.

10. The method of claim 1 wherein said imageable element is a lithographic printing plate precursor having an aluminum-containing substrate having a hydrophilic surface upon which said inner imageable layer is disposed.

11. The method of claim 1 wherein said imagewise exposure is carried out using imaging infrared radiation having a $\lambda_{max}$ of from about 750 to about 1200 nm.

12. The method of claim 11 wherein at least one of said one or more anionic surfactants is an alkyldiphenyloxide disulfonate that is present in said single processing solution in an amount of from about 3 to about 30 weight %.

13. The method of claim 1 wherein said single processing solution used in step B has a pH of from about 6.5 to about 10.

14. The method of claim 1 wherein said single processing solution comprises two or more anionic surfactants at least one of which is an alkyldiphenyloxide disulfonate that is present in an amount of from about 1 to about 30 weight %.

15. The method of claim 14 wherein said single processing solution comprises two or more different anionic surfactants one of which is an alkali alkyl naphthalene sulfonate that is present in an amount of from about 8 to about 20 weight %.

16. The method of claim 1 further comprising:

C) after applying the single processing solution, mechanically removing excess single processing solution, with optional drying.

17. The method of claim 16 wherein said excess single processing solution is removed using a squeegee or nip rollers.

18. A method of lithographic printing comprising:

A) using a laser providing infrared radiation, imagewise exposing a positive-working imageable element comprising a substrate having thereon, in order, an inner imageable layer and an outer imageable layer, to provide exposed and non-exposed regions, wherein either or both of said inner and outer imageable layers comprise a polymeric binder that has a backbone and pendant 1H-tetrazole groups attached to said backbone, B) applying a single processing solution having a pH of from about 5 to about 11 to said imaged element both: (1) to remove predominantly only said exposed regions, and (2) to provide a protective coating over all of said non-exposed and exposed regions to form a lithographic printing plate, C) removing excess single processing solution from said lithographic printing plate, and optionally drying said lithographic printing plate, and D) without removing said protective coating, using said lithographic printing plate for printing an image using a lithographic printing ink.

* * * * *